(12) United States Patent
Oh et al.

(10) Patent No.: US 9,985,227 B2
(45) Date of Patent: May 29, 2018

(54) DISPLAY DEVICE

(71) Applicant: Samsung Display Co., Ltd., Yongin-si, Gyeonggi-do (KR)

(72) Inventors: Hyunuk Oh, Yongin-si (KR); Nari Park, Yongin-si (KR); Jubong An, Yongin-si (KR); Yeonshil Jung, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/213,233

(22) Filed: Jul. 18, 2016

(65) Prior Publication Data

US 2017/0053976 A1 Feb. 23, 2017

(30) Foreign Application Priority Data

Aug. 21, 2015 (KR) .......................... 10-2015-0118278

(51) Int. Cl.
*H01L 51/00* (2006.01)
*H01L 27/32* (2006.01)

(52) U.S. Cl.
CPC ........ *H01L 51/0097* (2013.01); *H01L 27/326* (2013.01); *H01L 27/3244* (2013.01); *Y02E 10/549* (2013.01)

(58) Field of Classification Search
CPC . H01L 27/32; H01L 27/3237; H01L 27/3267; H01L 27/3276; H01L 27/3286; H01L 51/0097; H01L 2227/32; H01L 27/3244; H01L 27/326
See application file for complete search history.

(56) References Cited

U.S. PATENT DOCUMENTS

| | | | |
|---|---|---|---|
| 2004/0245529 A1* | 12/2004 | Yamazaki | H01L 27/3267 257/79 |
| 2006/0050031 A1 | 3/2006 | Suzuki et al. | |
| 2013/0076649 A1 | 3/2013 | Myers et al. | |
| 2015/0069341 A1 | 3/2015 | Kim et al. | |
| 2015/0095826 A1 | 4/2015 | Ahn et al. | |
| 2016/0313809 A1* | 10/2016 | Geum | G06F 1/163 |

FOREIGN PATENT DOCUMENTS

| | | |
|---|---|---|
| KR | 10-2014-0066253 A | 5/2014 |
| KR | 10-2014-0080734 A | 7/2014 |
| KR | 10-2015-0029158 A | 3/2015 |
| KR | 10-2015-0039030 A | 4/2015 |

* cited by examiner

*Primary Examiner* — Armando Rodriguez
(74) *Attorney, Agent, or Firm* — Knobbe, Martens, Olson & Bear, LLP (57) ABSTRACT

A display device is disclosed. In one aspect, the display device includes a substrate, a first light-emitting area allocated over the substrate and configured to display a first image, and an outer area surrounding the first light-emitting area and including a pad area. The outer area includes a second light-emitting area configured to display a second image independently from the first image of the first light-emitting area.

21 Claims, 8 Drawing Sheets

DISPLAY DEVICE

CROSS-REFERENCE TO RELATED APPLICATION

This application claims the benefit of Korean Patent Application No. 10-2015-0118278, filed on Aug. 21, 2015, in the Korean Intellectual Property Office, the disclosure of which is incorporated herein in its entirety by reference.

BACKGROUND

Field

The described technology generally relates to a display device.

Description of the Related Technology

Spurred by developments in information technology, market demand for display devices has risen. Today, flat panel displays such as liquid crystal displays (LCDs), organic light-emitting diode (OLED) displays, and electrophoretic displays (EPDs) are widely used.

Particularly, OLED displays and EPDs are being made flexible, and some of them have been implemented for wearable applications.

In OLED displays, pixels are arranged on a substrate in a matrix form, and thin film transistors (TFTs) are included in each pixel circuit to independently control the pixel's OLED.

OLED displays can be classified into top-emission type display devices and bottom-emission type display devices according to the direction in which light is emitted.

SUMMARY OF CERTAIN INVENTIVE ASPECTS

One inventive aspect relates to a display device that includes a first light-emitting area on a central portion of a substrate and displaying a screen, and an outer area on the outside of the first light-emitting area and including a pad unit, wherein a second light-emitting area displaying a screen separately from the first light-emitting area is in the outer area.

The outer area may include a light-blocking area generating no visible light, and the light-blocking area may include a first light-blocking area on an inner side of the substrate and a second light-blocking area separate from the first light-blocking area by as much as a predetermined distance and on an outer side of the first light-blocking area.

The second light-emitting area may be between the first light-blocking area and the second light-blocking area.

Each of the first light-blocking area, the second light-emitting area, and the second light-blocking area may have a ring shape surrounding the first light-emitting area along four sides of the first light-emitting area.

A circuit unit extending in a second direction may be on a left side and a right side of the first light-emitting area respectively in the first light-blocking area, and the circuit unit may include a thin film transistor, which is for driving screen display of the first light-emitting area and the second light-emitting area, on the substrate.

The outer area may include a first voltage line and a second voltage line, and the circuit unit may include gate wiring and an emission control line.

The first voltage line, the second voltage line, the gate wiring, and the emission control line may be connected to the second light-emitting area.

The first light-emitting area may include an OLED including a first electrode, an intermediate layer, and a second electrode, and the second light-emitting area may include the intermediate layer.

The second electrode may extend to the first light-emitting area, the first light-blocking area, and the second light-emitting area.

Another aspect is a display device that includes a first light-emitting area on a central portion of a substrate and displaying a screen, and an outer area on the outside of the first light-emitting area and including a pad unit, wherein a second light-emitting area displaying a screen separately from the first light-emitting area is in the outer area, the second light-emitting area is connected to the first light-emitting area, and the outer area includes a third light-blocking area on the outside of the second light-emitting area.

The second light-emitting area may have a ring shape surrounding the first light-emitting area along four sides of the first light-emitting area, and the third light-blocking area may have a ring shape surrounding the second light-emitting area along four sides of the second light-emitting area.

The second light-emitting area may include an OLED including a first electrode, an intermediate layer, and a second electrode, and a circuit unit including a thin film transistor, which is for driving screen display of the first light-emitting area and the second light-emitting area, on the substrate.

The outer area may include a first voltage line and a second voltage line, and the circuit unit may include gate wiring and an emission control line.

The first voltage line, the second voltage line, the gate wiring, and the emission control line may be connected to the second light-emitting area.

The substrate may include a flexible material, and the first light-blocking area may be bent to bend the substrate.

Another aspect is a display device that includes a first light-emitting area on a central portion of a substrate and displaying a screen, a light-blocking area on the outside of the first light-emitting area of the substrate, the light-blocking area including a first light-blocking area and a second light-blocking area separate from the first light-blocking area by as much as a predetermined distance and on the outside of the first light-blocking area, and a second light-emitting area between the first light-blocking area and the second light-blocking area and separated from the first light-emitting area to display a separate screen.

Another aspect is a display device comprising: a substrate; a first light-emitting area allocated over the substrate and configured to display a first image; and an outer area surrounding the first light-emitting area and including a pad area, wherein the outer area includes a second light-emitting area configured to display a second image independently from the first image of the first light-emitting area.

In the above display device, the outer area comprises a light-blocking area, wherein the light-blocking area comprises a first light-blocking area and a second light-blocking area separated from the first light-blocking area, and wherein the second light-blocking area surrounds the first light-blocking area.

In the above display device, the second light-emitting area is interposed between the first and second light-blocking areas.

In the above display device, each of the first light-blocking area, the second light-emitting area, and the second light-blocking area has a ring shape surrounding the first light-emitting area.

The above display device further comprises a circuit area located on opposing sides of the first light-emitting area in the first light-blocking area, wherein the circuit area comprises a plurality of thin film transistors (TFTs) configured to drive the first and light-emitting areas to respectively display the first and second images.

In the above display device, the outer area comprises first and second voltage lines, wherein the circuit area comprises gate wiring and an emission control line.

In the above display device, the first voltage line, the second voltage line, the gate wiring, and the emission control line are electrically connected to the second light-emitting area.

In the above display device, the first light-emitting area comprises an organic light-emitting diode (OLED) comprising a first electrode, an intermediate layer, and a second electrode, wherein the second light-emitting area is included in the intermediate layer.

In the above display device, the second electrode extends to the first light-emitting area, the first light-blocking area, and the second light-emitting area.

In the above display device, the substrate is flexible, wherein the first light-blocking area permits bending of the substrate.

In the above display device, the second light-emitting area is connected to the first light-emitting area, wherein the outer area comprises a third light-blocking area disposed outside of the second light-emitting area.

In the above display device, the second light-emitting area has a ring shape surrounding the first light-emitting area, wherein the third light-blocking area has a ring shape surrounding the second light-emitting area.

In the above display device, the second light-emitting area comprises: an OLED comprising a first electrode, an intermediate layer, and a second electrode; and a circuit area comprising a plurality of TFTs configured drive the first and second light-emitting areas to respectively display the first and second images.

In the above display device, the outer area comprises first and second voltage lines, wherein the circuit area comprises gate wiring and an emission control line.

In the above display device, the first voltage line, the second voltage line, the gate wiring, and the emission control line are electrically connected to the second light-emitting area.

Another aspect is a display device comprising: a substrate; a first light-emitting area allocated over the substrate and configured to display a first image; a light-blocking area disposed surrounding the first light-emitting area and comprising a first light-blocking area and a second light-blocking area separated from the first light-blocking area, wherein the second light-blocking area surrounds the first light-blocking area; and a second light-emitting area interposed between the first and second light-blocking areas and separated from the first light-emitting area to display a second image different from the first image.

In the above display device, the second light-blocking area has three edges surrounding the second light-emitting area, wherein the display device further comprises a pad area connecting ends of two of the edges of the second light-blocking area.

In the above display device, each of the first and second light-emitting areas comprises a plurality of organic light-emitting diodes (OLEDs), wherein the display device further comprises a circuit area disposed in the first light-blocking area and includes circuitry configured to drive the OLEDs in the first and second light-emitting areas.

In the above display device, the circuit area extends parallel to the second light-emitting area on opposing sides of the first light-emitting area.

In the above display device, the widths of the first and second light-blocking areas are substantially the same.

According to at least one of the disclosed embodiments, a portion of an outer area may be configured as a second light-emitting area to provide unique user experience (UX).

DETAILED DESCRIPTION OF CERTAIN INVENTIVE EMBODIMENTS

As the described technology allows for various changes and numerous embodiments, exemplary embodiments will be illustrated in the drawings and described in detail in the written description. Advantages and features of one or more exemplary embodiments and methods of accomplishing the same may be understood more readily by reference to the following detailed description of the one or more exemplary embodiments and the accompanying drawings. The described technology may, however, be embodied in many different forms and should not be construed as being limited to the one or more exemplary embodiments set forth herein.

Hereinafter, the described technology will be described in detail with reference to the accompanying drawings, in which exemplary embodiments are shown. Like reference numerals in the drawings denote like elements, and thus a repeated description thereof will be omitted.

While such terms as "first" and "second" may be used to describe various components, such components must not be limited to the above terms. The above terms are used only to distinguish one component from another.

The singular forms "a," "an," and "the" used herein are intended to include the plural forms as well, unless the context clearly indicates otherwise.

It will be understood that the terms such as "include," "comprise," and "have" used herein specify the presence of stated features or components, but do not preclude the presence or addition of one or more other features or components.

Sizes of components in the drawings may be exaggerated for convenience of explanation. In other words, since sizes and thicknesses of components in the drawings are arbitrarily illustrated for convenience of explanation, exemplary embodiments are not limited thereto.

When an embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 1:
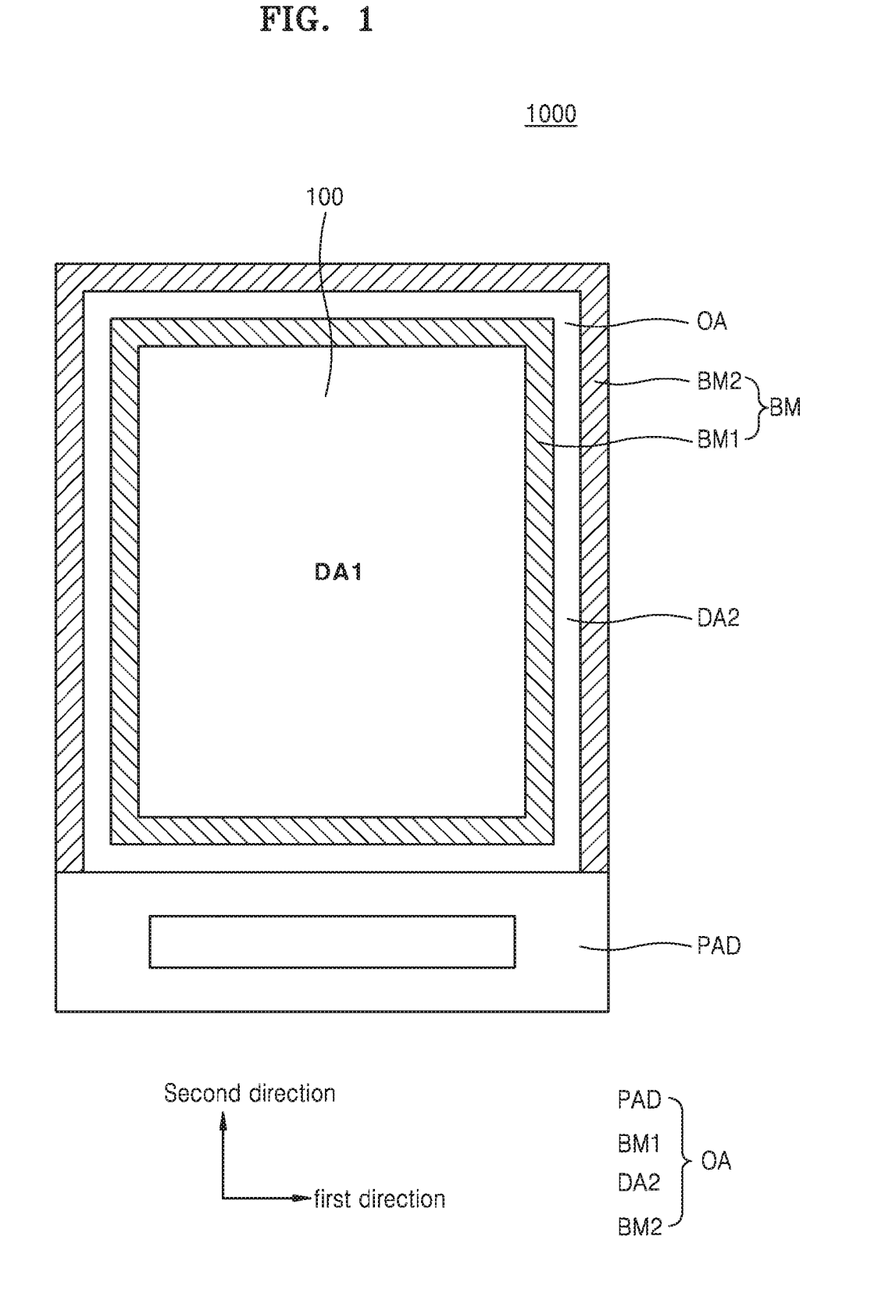
FIG. 1 is a schematic plan view of an area of a substrate of a display device according to an exemplary embodiment.
Figure 2:
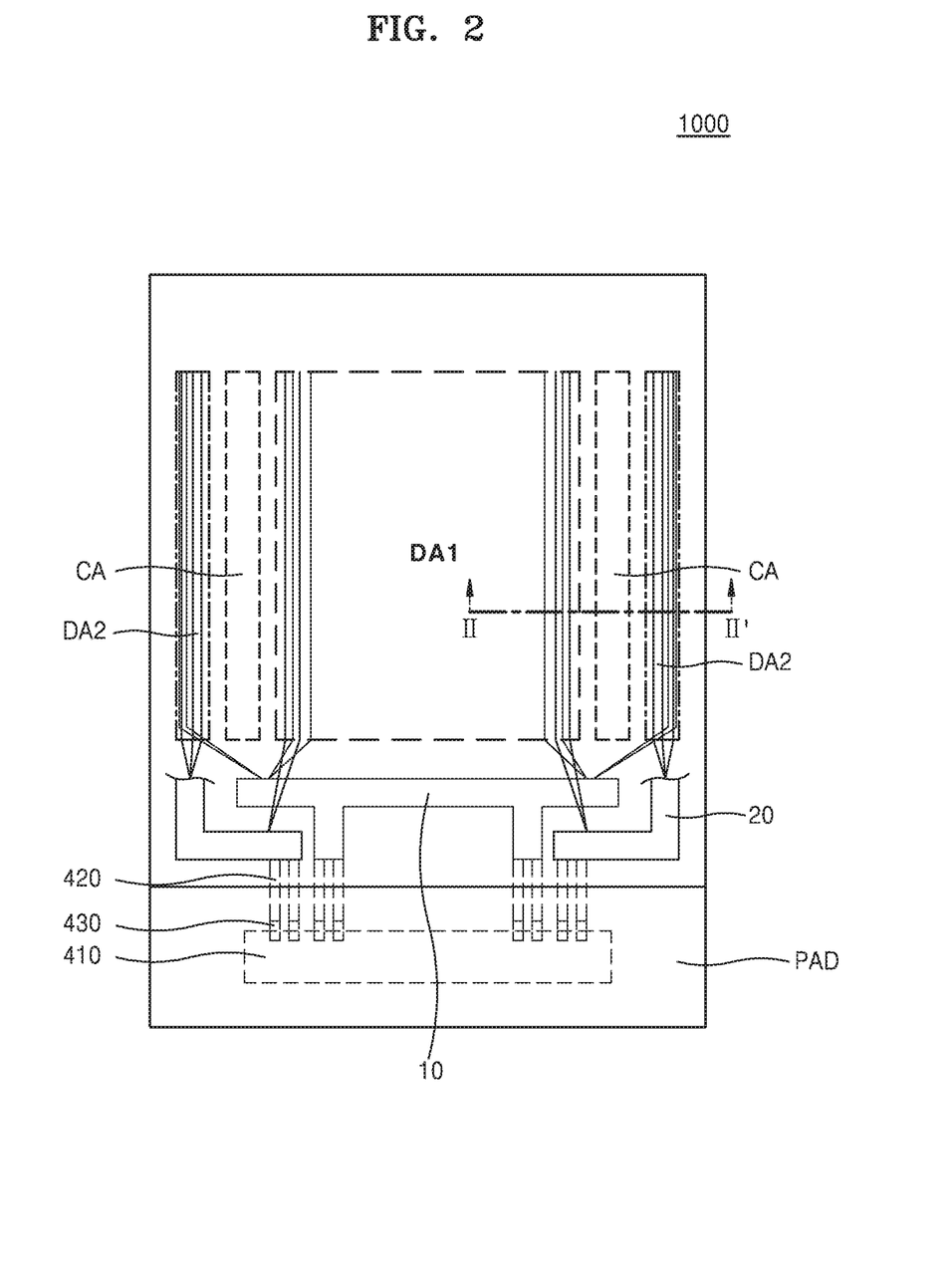
FIG. 2 is a schematic plan view of wiring and a driver of a display device according to an exemplary embodiment.
Figure 3:
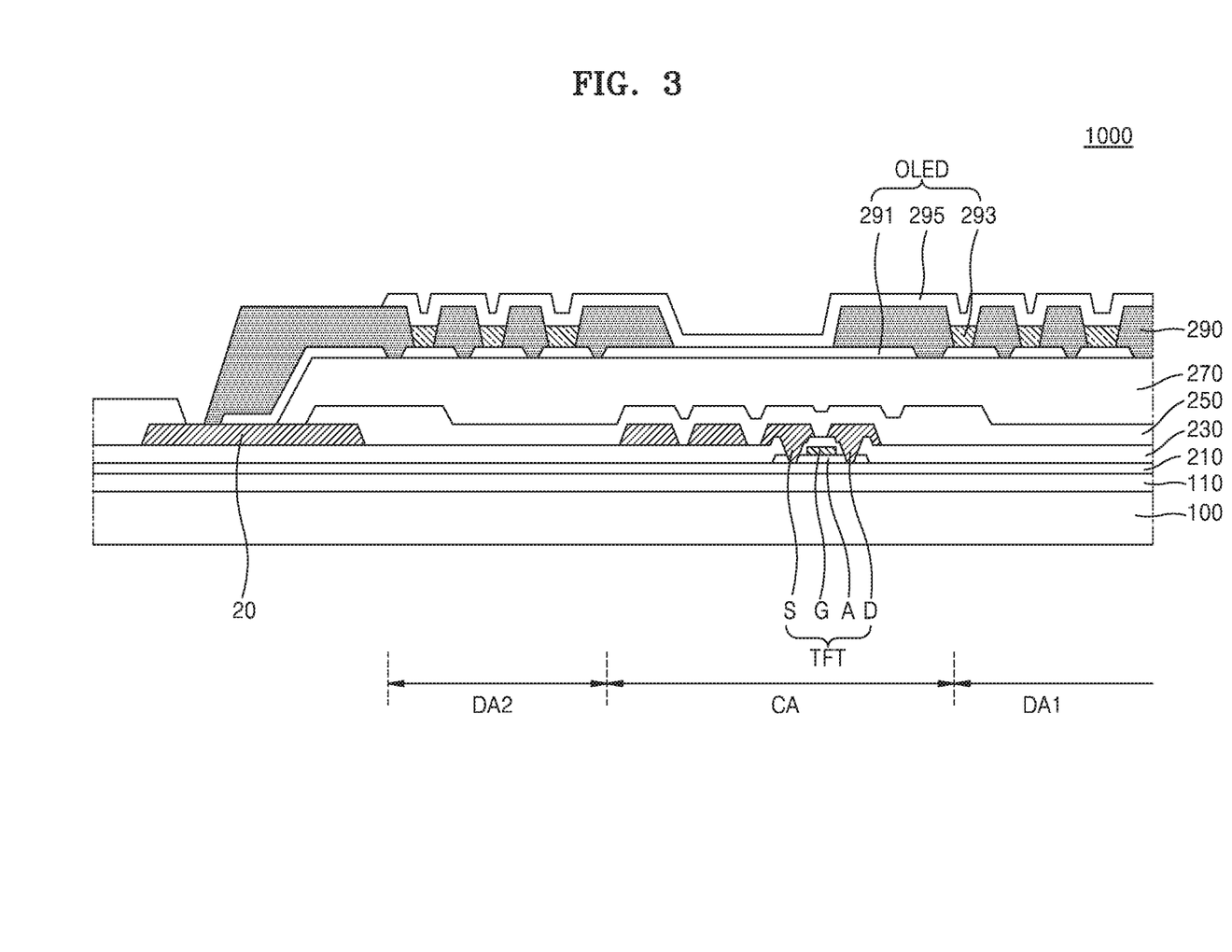
FIG. 3 is a cross-sectional view taken along line II-II' of FIG. 2.

FIG. 1 is a schematic plan view of an area of a substrate 100 of a display device 1000 according to an exemplary embodiment. FIG. 2 is a schematic plan view of wiring and a driver of the display device 1000. FIG. 3 is a cross-sectional view taken along line II-II' of FIG. 2.

The display device 1000 according to the present exemplary embodiment may include a first light-emitting area DA1 on a central portion of the substrate 100 and for displaying a screen, and an outer (edge) area OA at a perimeter of the first light-emitting area DA1 of the substrate 100.

As illustrated in FIG. 1, the first light-emitting area DA1 for displaying a screen may have a substantially rectangular shape. However, the shape of the first light-emitting area DA1 is not limited thereto.

The first light-emitting area DA1 displays a screen by generating visible light so that the screen is visible to a user. The first light-emitting area DA1 may include one or more devices, and for example, may include an OLED, a LCD device, or the like.

In the display device 1000 according to the present exemplary embodiment, the first light-emitting area DA1 includes an OLED.

The OLED may include a first electrode 291, an intermediate layer 293 including an organic emission layer, and a second electrode 295.

As holes and electrons injected from the first electrode 291 and the second electrode 295 of the OLED combine in the organic emission layer of the intermediate layer 293, light may be generated.

The first electrode 291 and the second electrode 295 may be formed of one or more conductive materials.

In an exemplary embodiment, the first electrode 291 and/or the second electrode 295 may be formed of a light-transmissive material or a reflective material.

The light-transmissive material may include indium tin oxide (ITO), indium zinc oxide (IZO), zinc oxide (ZnO), or indium oxide ($In_2O_3$), and the reflective material may include silver (Ag), magnesium (Mg), aluminum (Al), platinum (Pt), palladium (Pd), gold (Au), nickel (Ni), neodymium (Nd), iridium (Ir), chromium (Cr), a compound thereof, or the like.

The intermediate layer 293 may be formed between the first electrode 291 and the second electrode 295 and may include an organic emission layer.

In exemplary embodiment, the intermediate layer 293 includes an organic emission layer and in addition, may further include at least one of a hole injection layer, a hole transport layer, an electron transport layer, and an electron injection layer. However, the described technology is not limited thereto, and the intermediate layer 293 may include an organic emission layer and may further include one or more other functional layers.

In an exemplary embodiment, a second light-emitting area DA2 for displaying a screen separately from the first light-emitting area DA1 is formed in the outer area OA at the outside of the first light-emitting area DA1 of the substrate 100.

That is, in the display device 1000 according to the present exemplary embodiment, not only a circuit unit but also the second light-emitting area DA2 may be provided on an edge area of the substrate 100 except the first light-emitting area DA1, and the second light-emitting area DA2 may generate visible light so that the screen is visible to the user separately from the first light-emitting area DA1.

The second light-emitting area DA2, which is an area of displaying a separate screen from the first light-emitting area DA1, may display the same screen as the first light-emitting area DA1 and may also display a different screen from the first light-emitting area DA1.

In the display device 1000 according to the present exemplary embodiment, the second light-emitting area DA2, like the first light-emitting area DA1, includes the OLED. However, the device which may be included in the second light-emitting area DA2 is not limited thereto, and the second light-emitting area DA2 may include a device generating various visible rays, for example, a LCD device.

When the OLED is included in the second light-emitting area DA2, the first electrode, 291, the intermediate layer 293 including an organic emission layer, and the second electrode 295 may be formed in the second light-emitting area DA2.

That is, in the display device 1000 according to the present exemplary embodiment, the intermediate layer 293 may be formed by deposition not only in the first light-emitting area DA1 but also in the second light-emitting area DA2 in the outer area OA.

Also, as illustrated in FIG. 3, the second electrode 295 may extend to the second light-emitting area DA2.

In an exemplary embodiment, the second light-emitting area DA2 has a ring shape along four sides of the first light-emitting area DA1 in the outer area OA, as illustrated in FIG. 1.

As the display device 1000 according to the present exemplary embodiment includes, besides the first light-emitting area DA1 on the central portion of the substrate 100, the second light-emitting area DA2, which is separate from the first light-emitting area DA1, in the outer area OA, the display device 1000 may provide a diverse and unique user experience (UX) according to the use of a product.

Also, the second light-emitting area DA2 may include a structure having one or more functions, such as a touch sensor, separately from the first light-emitting area DA1.

In the display device 1000 according to the present exemplary embodiment, the outer area OA may include a light-blocking area BM, as illustrated in FIG. 1. The light-blocking area BM, which is an area generating no visible light, does not display a screen and may be recognized by the user as a bezel portion having colors such as white and black due to an ink layer, a light-blocking member, and the like.

In an exemplary embodiment, the light-blocking area BM includes a first light-blocking area BM1 and a second light-blocking area BM2. Although it is illustrated in FIG. 1 that the light-blocking area BM includes the first light-blocking area BM1 and the second light-blocking area BM2, the number of light-blocking areas is not limited thereto.

The first light-blocking area BM1 may be at an inner side of the substrate 100 in the outer area OA, and the second light-blocking area BM2 may be separate from the first light-blocking area BM1 by as much as a predetermined distance and disposed at the outside of the first light-blocking area BM1.

That is, the first light-blocking area BM1 in the outer area OA may be closest to the central portion of the substrate 100 and connected to the first light-emitting area DA1.

In an exemplary embodiment, the second light-emitting area DA2 is formed between the first light-blocking area BM1 and the second light-blocking area BM2.

For example, the display device 1000 according to the present exemplary embodiment sequentially includes the first light-emitting area DA1, the first light-blocking area BM1, the second light-emitting area DA2, and the second light-blocking area BM2 from the central portion of the substrate 100 to the outside of the substrate 100 along a first direction (refer to FIG. 1).

The second light-emitting area DA2 may be separate from the first light-emitting area DA1 by as much as a width of the first light-blocking area BM1.

In an exemplary embodiment, the first light-blocking area BM1 and the second light-blocking area BM2, like the second light-emitting area DA2, have a ring shape surrounding the first light-emitting area DA1 along the four sides of the first light-emitting area DA1.

That is, the first light-blocking area BM1 has a ring shape along the four sides of the first light-emitting area DA1, and the second light-emitting area DA2 has a ring shape along four sides of the first light-blocking area BM1 at the outside of the first light-blocking area BM1.

Also, the second light-blocking area BM2 may have a ring shape along four sides of the second light-emitting area DA2 at the outside of the second light-emitting area DA2.

Voltage lines, namely, a first voltage line 10 and a second voltage line 20, supplying power to the first light-emitting area DA1 and/or the second light-emitting area DA2 may be disposed in the outer area OA.

The first and second voltage lines 10 and 20 supplying power to a light-emitting area may include a first voltage line 10 and a second voltage line 20. Although FIG. 2 schematically illustrates portions of the first voltage line 10 and the second voltage line 20 for convenience of description, forms of the first voltage line 10 and the second voltage line 20 are not limited thereto. In an exemplary embodiment, the first voltage line 10 may be a driving voltage line, and the second voltage line 20 may be a common voltage line.

A driving voltage may be a predetermined high-level voltage, and a common voltage may be a voltage lower than the driving voltage or a ground voltage.

Also, a pad unit (or pad area) PAD transmitting an electric signal from a power supply apparatus (not shown) or a signal generating apparatus (not shown) to the first light-emitting area DA1 and/or the second light-emitting area DA2 may be disposed in the outer area OA.

The pad unit PAD may include a driver IC 410, a pad 430 connecting a driver IC and a pixel circuit to each other, and fan-out wiring 420.

The driver IC 410 may include a data driver for supplying a data signal. The driver IC 410 may also include various functional units for driving the pixel circuit. The driver IC 410 is mounted on the substrate 100 by using a chip-on-glass (COG) method. A side of the driver IC 410 includes a connection terminal (not shown) electrically connected to the pad 430 on the substrate 100. An adhesive material including a conductive ball and thus allowing electricity to flow may be disposed between the pad 430 and the connection terminal (not shown) to bond the pad 430 and the connection terminal (not shown). For example, an anisotropic conductive film, a self-organizing conductive film, or the like may be used as the adhesive material.

The pad 430 is formed on the substrate 100, and the connection terminal (not shown) is electrically connected thereto. The pad 430 is electrically connected to the fan-out wiring 420. As shown in FIG. 2, the pad 430 may be formed on a different layer from the fan-out wiring 420, but is not limited thereto. The pad 430 may extend from the fan-out wiring 420 and thus may be disposed on the same layer as the fan-out wiring 420. The pad 430 may include a single layer or layers formed of a material including at least one selected from molybdenum (Mo), aluminum (Al), copper (Cu), silver (Ag), and titanium (Ti).

The fan-out wiring 420 may connect the pad 430 and the pixel circuit to each other.

In the display device 1000 according to an exemplary embodiment, a circuit unit CA may be formed in the outer area OA.

In an exemplary embodiment, the circuit unit CA is formed in the first light-blocking area BM1 included in the outer area OA. As illustrated in FIG. 2, the circuit unit CA may extend in a second direction (refer to FIG. 1) crossing the first direction.

Circuit units CA may be respectively formed on a left side and a right side of the first light-emitting area DA1 with the first light-emitting area DA1 as the center. The left side and the right side respectively are a left side and a right side from the user's point of view of FIG. 2.

The circuit unit CA may include a thin film transistor TFT on the substrate 100 in order to drive a device so that a screen may be displayed on the first light-emitting area DA1 and/or the second light-emitting area DA2.

Hereinafter, the thin film transistor TFT included in the circuit unit CA will be briefly described with reference to a cross-sectional view of the display device 1000 illustrated in FIG. 3.

The substrate 100 may include one or more materials. For example, the substrate 100 is formed of glass or another insulating material, or may include a metal thin film.

In an exemplary embodiment, the substrate 100 is formed of a flexible material. For example, the substrate 100 is formed of an organic material.

In an exemplary embodiment, the substrate 100 is formed of at least one of silicone-based polymer, polyurethane, polyurethane acrylate, acrylate polymer, and acrylate terpolymer. In this regard, the silicone-based polymer may include, for example, polydimethylsiloxane (PDMS), hexamethyldisiloxane (HMDSO), or the like.

A buffer layer 110 may be formed on the substrate 100. The buffer layer 110 may planarize a top surface of the substrate 100 and may block a foreign material or moisture penetrating through the substrate 100. For example, the buffer layer 110 is formed of an inorganic material, such as silicon oxide, silicon nitride, silicon oxynitride, aluminum oxide, aluminum nitride, titanium oxide, or titanium nitride, or an organic material, such as polyimide, polyester, or acrylic, and may include a plurality of stacks including the above-described materials. The buffer layer 110 may be formed in the first light-emitting area DA1 and may extend to the outer area OA so as to be disposed therein.

The thin film transistor TFT may include an active layer A, a gate electrode G, a source electrode S, and a drain electrode D.

Hereinafter, a case in which the thin film transistor TFT is a top gate-type transistor sequentially including the active layer A, the gate electrode G, the source electrode S, and the drain electrode D will be described. However, the present exemplary embodiment is not limited thereto, and one or more types of thin film transistors such as a bottom gate-type transistor may be used.

The active layer A may include polysilicon and may include a channel region not doped with impurities, and a source region and a drain region doped with impurities in both sides of the channel region. In this regard, impurities may vary depending on the type of the thin film transistor TFT and may be N-type impurities or P-type impurities.

After the active layer A is formed, on the active layer A, a gate insulating layer 210 may be formed over the entire surface of the substrate 10. The gate insulating layer 210 may have a multi-layer or single layer structure formed of an inorganic material, such as silicon oxide or silicon nitride. The gate insulating layer 210 insulates the active layer A from the gate electrode G on the active layer A.

After the gate insulating layer 210 is formed, the gate electrode G may be formed on the gate insulating layer 210. The gate electrode G may be formed through a photolithography process and an etching process.

The gate electrode G is formed on the gate insulating layer 210. The gate electrode G may be connected to gate wiring (not shown) applying on/off signals to the thin film transistor TFT.

The gate electrode G may include a metal material having low resistance. The gate electrode G may have a single layer or multi layer structure formed of one or more materials selected from, for example, aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) by taking into account factors such as closeness to an adjacent layer, surface smoothness of a layer to be stacked, and ease of processing.

After the gate electrode G is formed, an interlayer insulating layer 230 may be formed over the entire surface of the substrate 100. The interlayer insulating layer 230 insulates the gate electrode G from the source electrode S and the drain electrode D.

The interlayer insulating layer 230 may be formed of an inorganic material. In an exemplary embodiment, the interlayer insulating layer 230 is formed of metal oxide or metal nitride. In detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

The interlayer insulating layer 230 is formed of an inorganic material, such as silicon oxide (SiOx) and/or silicon nitride (SiNx), in a multi-layered or single-layered structure. In some embodiments, the interlayer insulating layer 230 has a double-layer structure of SiOx/SiNy or SiNx/SiOy.

The source electrode S and the drain electrode D of the thin film transistor TFT may be disposed on the interlayer insulating layer 230. The source electrode S and the drain electrode D may be formed of one or more materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), in a single-layered or multi-layered structure. The source electrode S and the drain electrode D may contact an area of the active layer A.

A passivation layer 250 may be formed over the entire surface of the substrate 100 to cover the source electrode S and the drain electrode D.

The passivation layer 250 may protect the thin film transistor TFT and may be formed of an inorganic material, an organic material, or an organic/inorganic compound in a single-layer or multilayer structure. In some embodiments, the passivation layer 250 is formed of one or more materials selected from polyacrylate resin, epoxy resin, phenolic resin, polyamide resin, polyimide resin, unsaturated polyester resin, polyphenylene ether resin, polyphenylene sulfide resin, and benzocyclobutene (BCB).

On the passivation layer 250, a planarizing layer 270 may be formed over the entire surface of the substrate 100. The planarizing layer 270 removes a step difference due to the thin film transistor TFT and planarizes the top surface of the passivation layer 250, thereby preventing the occurrence of defects in the OLED display due to a lower uneven portion of the planarizing layer 270.

The planarizing layer 270 may be formed of an insulating material. For example, the planarizing layer 270 is formed of an inorganic material, an organic material, or an organic/inorganic compound in a single-layer or multilayer structure and may be formed using any of various deposition methods. In some embodiments, the planarizing layer 270 is formed of one or more materials selected from polyacrylate resin, epoxy resin, phenolic resin, polyamide resin, polyimide resin, unsaturated polyester resin, polyphenylene ether resin, polyphenylene sulfide resin, and BCB.

The OLED display is provided on the planarizing layer 270. The OLED display includes the first electrode 291, the intermediate layer 293 including an organic emission layer, and the second electrode 295.

The intermediate layer 293 including the organic emission layer may be formed in the first light-emitting area DA1 and the second light-emitting area DA2, and the second electrode 295 formed on the intermediate layer 293 may extend from the first light-emitting area DA1 to the first light-blocking area BM1 and the second light-emitting area DA2.

A pixel-defining layer 290 may be formed on the second electrode 295, the pixel-defining layer 290 including an insulating material. The pixel-defining layer 290 may be formed of one or more organic insulating materials of polyimide, polyamide, acrylic resin, benzocyclobutene, and phenolic resin and may be formed by using a method such as spin coating.

The pixel-defining layer 290 may define a pixel region and a non-pixel region. That is, the first light-emitting area DA1 and the second light-emitting area DA2 may be defined by the pixel-defining layer 290. The pixel-defining layer 290 may include an aperture via which part of the first electrode 291 is exposed and may cover the entire surface of the substrate 100.

In an exemplary embodiment, the circuit unit CA includes gate wiring (not shown) and emission control wiring (not shown).

The gate wiring (not shown) may be formed of the same material and on the same layer as the gate electrode G of the thin film transistor TFT and may be connected to the gate electrode G.

The emission control wiring (not shown) may generate an emission control signal and transmit the emission control signal to the first light-emitting area DA1 and/or the second light-emitting area DA2. The emission control signal may control the light-emitting time of the first light-emitting area DA1 and/or the second light-emitting area DA2.

The gate wiring (not shown) and the emission control wiring (not shown) may be connected to the second light-emitting area DA2 to display a screen.

In the display device 1000 according to the present exemplary embodiment, the first voltage line 10 and the second voltage line 20 may be connected to the second light-emitting area DA2, as illustrated in FIG. 2. The first and second voltage lines 10 and 20 connected to the second light-emitting area DA2 are schematically illustrated in FIG. 2, and the number and form of voltage lines are not limited thereto.

As described above, the first voltage line 10 may be a driving voltage line, the second voltage line 20 may be a common voltage line, and the first voltage line 10 and the second voltage line 20 may supply a voltage to the second light-emitting area DA2.

In the display device 1000 according to the present exemplary embodiment, the separate second light-emitting area DA2 may be formed on the outside of the first light-emitting area DA1, and in an exemplary embodiment, may be formed between the first light-blocking area BM1 and the second light-blocking area BM2 included in the light-blocking area BM to display a screen.

The circuit unit CA may be included in the first light-blocking area BM1 between the first light-emitting area DA1 and the second light-emitting area DA2 to drive a device of the first light-emitting area DA1 and the second light-emitting area DA2.

The gate wiring (not shown), the emission control wiring (not shown), the first voltage line 10, and the second voltage line 20 may be connected to the second light-emitting area DA2 in order to drive a device and display a screen separately from the first light-emitting area DA1, and the first electrode 291, the intermediate layer 293, and the second electrode 295 included in the OLED display may extend to the second light-emitting area DA2.

Figure 4:
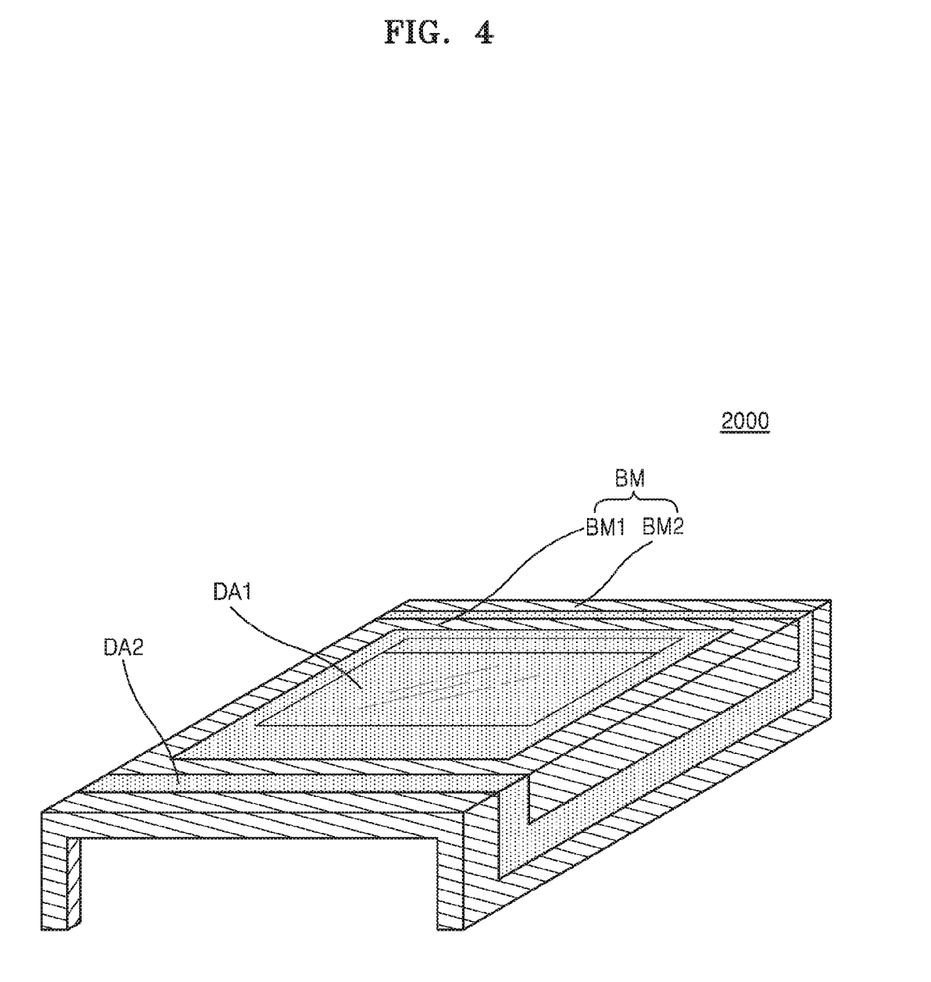
FIG. 4 illustrates a display device according to another exemplary embodiment.

FIG. 4 illustrates a display device 2000 according to another exemplary embodiment.

In an exemplary embodiment, the display device 2000 according to an exemplary embodiment includes the substrate 100 formed of a flexible material and thus capable of being two-dimensionally stretched.

The substrate 100 may be formed of a material having a Poisson's ratio of about 0.4 or greater. The Poisson's ratio refers to a ratio of the proportional decrease in one direction to the proportional increase in length in a sample of material that is stretched in the other direction. As the substrate 100 includes the material having a Poisson's ratio of about 0.4 or greater, that is, the substrate 100 has properties of being easily stretched, the substrate 100 may have improved flexibility and may have a bending area. Thus, the display device 2000 may easily include a bending area.

In an exemplary embodiment, the first light-blocking area BM1 may correspond to the bending area. That is, a portion of the substrate 100 that corresponds to the first light-blocking area BM1 may be bent, and thus, the display device 2000 may be bent.

That is, when a user sees the display device 2000, the first light-emitting area DA1 may be displayed on a front surface of the display device 2000, and the second light-emitting area DA2 may be displayed on a side surface of the display device 2000.

In the display device 2000 according to the present exemplary embodiment, the first light-blocking area BM1 generating no light may be on a bending portion of the display device 2000, and the first light-emitting area DA1 and the second light-emitting area DA2 for displaying a screen may be respectively displayed on the front surface and the side surface of the display device 2000.

Also, as the bending area corresponds to the first light-blocking area BM1, the display device 2000 may have an ultra slim structure.

Figure 5:
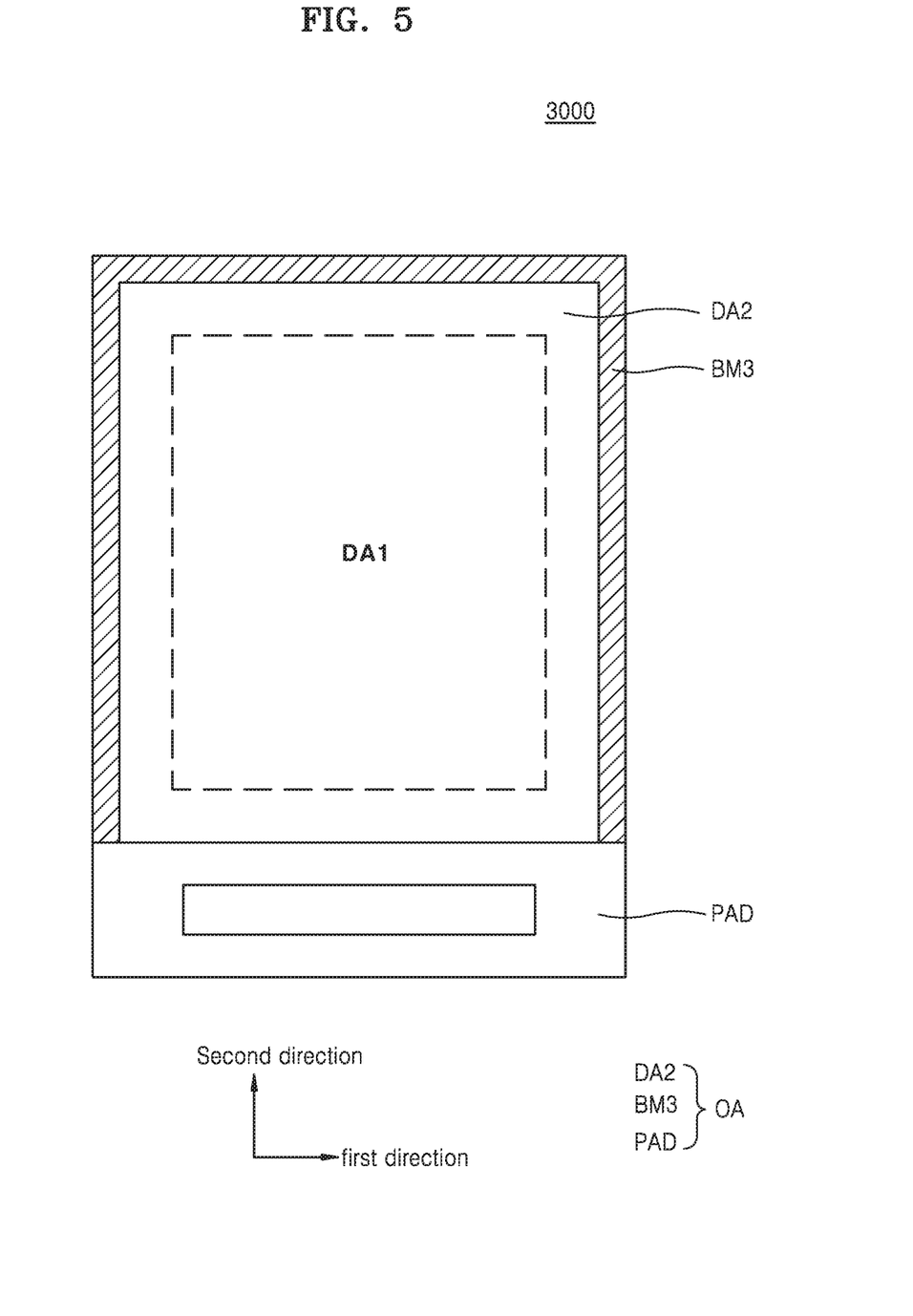
FIG. 5 is a schematic plan view of an area of a substrate of a display device according to another exemplary embodiment.
Figure 6:
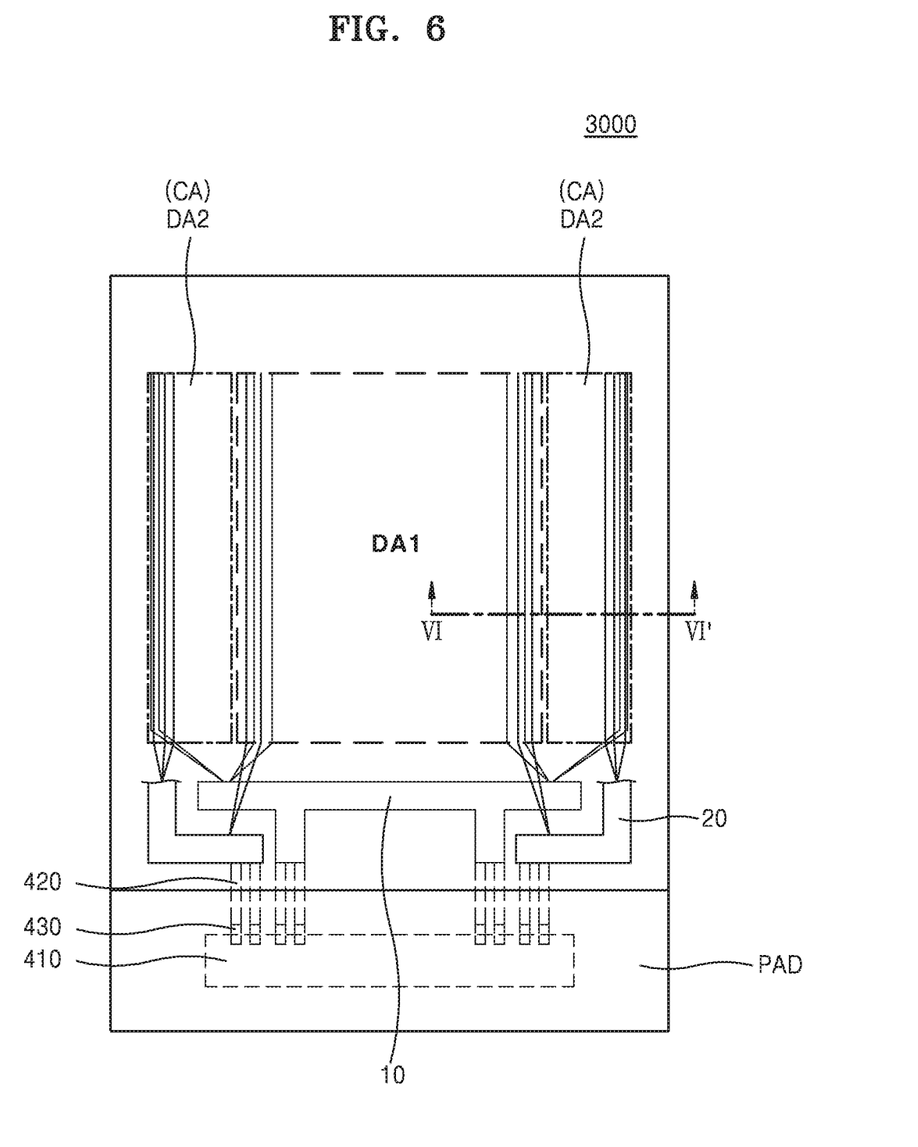
FIG. 6 is a schematic plan view of wiring and a driver of a display device according to another exemplary embodiment.
Figure 7:
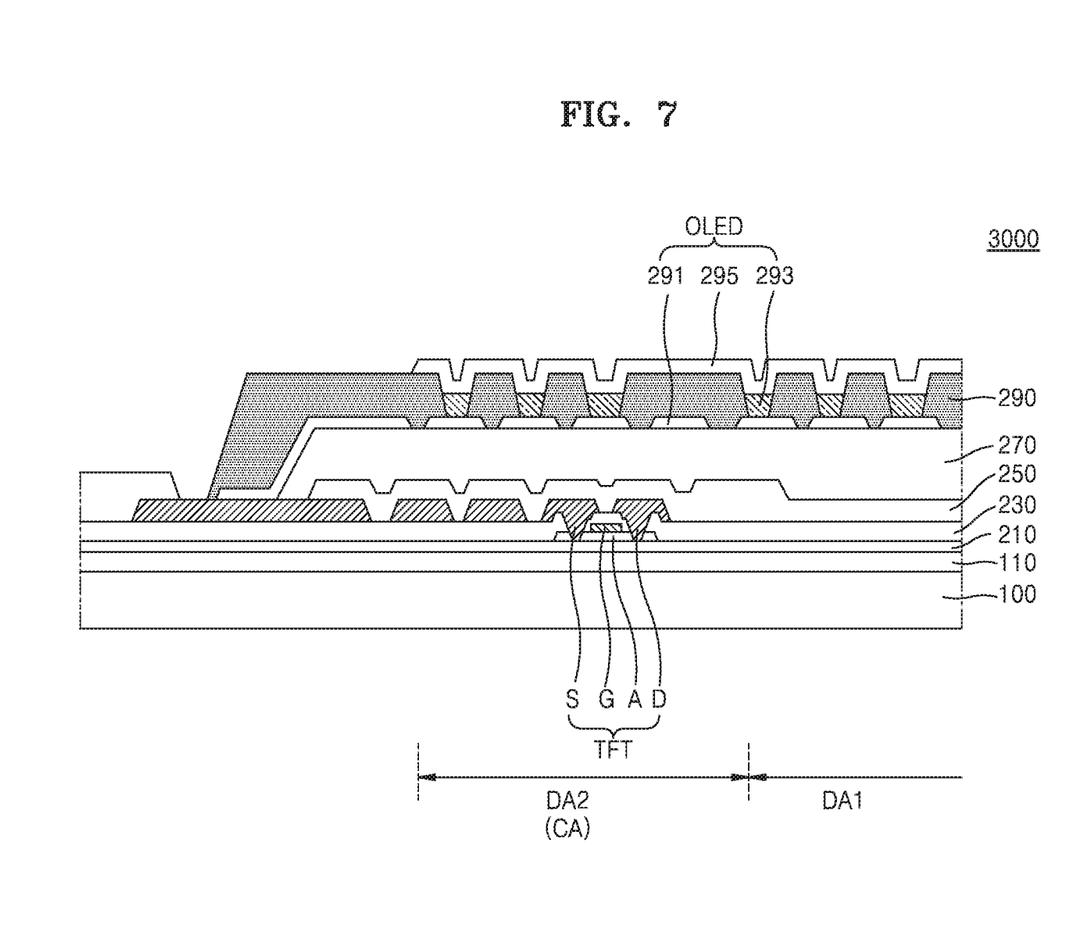
FIG. 7 is a cross-sectional view taken along line VI-VI' of FIG. 6.

FIG. 5 is a schematic plan view of an area of the substrate 100 of a display device 3000 according to another exemplary embodiment. FIG. 6 is a schematic plan view of wiring and a driver of the display device 3000. FIG. 7 is a cross-sectional view taken along line VI-VI' of FIG. 6.

Like reference numerals between FIGS. 1 to 3 and FIGS. 5 to 7 denote like elements, and thus, repeated descriptions thereof will be omitted for simplification of description.

As illustrated in FIG. 5, the display device 3000 according to the present exemplary embodiment includes the first light-emitting area DA1 on a central portion of the substrate 100 and for displaying a screen, and the outer area OA on the outside of the first light-emitting area DA1 and including the pad unit PAD.

The first light-emitting area DA1 displays a screen by generating visible light so that the screen is visible to a user. The first light-emitting area DA1 may include one or more devices, and for example, may include an OLED, a (LCD) device, or the like.

In the display device 3000 according to the present exemplary embodiment, the first light-emitting area DA1 includes the OLED.

The OLED may include the first electrode 291, the intermediate layer 293 including an organic emission layer, and the second electrode 295.

The outer area OA may include the second light-emitting area DA2 for displaying a screen separately from the first light-emitting area DA1.

The second light-emitting area DA2 may be formed on the most inner portion of the substrate 100 in the outer area OA. That is, the second light-emitting area DA2 may be closest to the first light-emitting area DA1 on the central portion of the substrate 100.

In an exemplary embodiment, as illustrated in FIGS. 5 to 7, the second light-emitting area DA1 may be connected to the first light-emitting area DA1.

The second light-emitting area DA2, on which a screen is displayed by driving of a device separately from the first light-emitting area DA1, may display the same screen as the first light-emitting area DA1 and may also display a different screen from the first light-emitting area DA1.

The second light-emitting area DA1, like the first light-emitting area DA1, may include the OLED.

In an exemplary embodiment, the second electrode 295 included in the OLED of the first light-emitting area DA1 may extend to the second light-emitting area DA2 connected to the first light-emitting area DA1.

Also, the intermediate layer 293 included in the OLED of the first light-emitting area DA1 may be formed in the second light-emitting area DA2 as well.

That is, the second light-emitting area DA2 may also include the OLED including the first electrode 291, the intermediate layer 293 including an organic emission layer, and the second electrode 295 and thus may generate visible light, thereby displaying a screen separately from the first light-emitting area DA1.

In an exemplary embodiment, as illustrated in FIG. 5, the second light-emitting area DA2 may have a ring shape surrounding, at the outside of the first light-emitting area DA1, the first light-emitting area DA1 along four sides of the first light-emitting area DA1.

In the display device 3000 according to the present exemplary embodiment, the outer area OA includes a third light-blocking area BM3 on the outside of the second light-emitting area DA2.

The third light-blocking area BM3, which is an area generating no visible light, does not display a screen and may be recognized by the user as a bezel portion having colors such as white and black due to an ink layer, a light-blocking member, and the like.

In an exemplary embodiment, the third light-blocking area BM3 has a ring shape surrounding the second light-emitting area DA2 along four sides of the second light-emitting area DA2.

That is, the display device 3000 according to the present exemplary embodiment may sequentially include the first light-emitting area DA1, the second light-emitting area DA2, and the third light-blocking area BM3 from the central portion of the substrate 100 to the outside of the substrate 100 along a first direction (refer to FIG. 5).

In the outer area OA, the first and second voltage lines 10 and 20 supplying power to the first light-emitting area DA1 and/or the second light-emitting area DA2 may be disposed. In an exemplary embodiment, the first voltage line 10 is a driving voltage line, and the second voltage line 20 is a common voltage line.

Each of the first voltage line 10 and the second voltage line 20 may be connected to both of the first light-emitting area DA1 and the second light-emitting area DA2 to supply a voltage to the first light-emitting area DA1 and the second light-emitting area DA2.

Also, in the outer area OA, the pad unit PAD transmitting an electric signal from a power supply apparatus (not shown) or a signal generating apparatus (not shown) to the first light-emitting area DA1 and/or the second light-emitting area DA2 may be disposed.

The pad unit PAD may include the driver IC 410, the pad 430 connecting a driver IC and a pixel circuit to each other, and the fan-out wiring 420. A description of the pad unit PAD is identical to that described above with reference to FIGS. 1 to 3 and therefore, will be omitted hereinafter for convenience of description, and differences will be mainly described.

In an exemplary embodiment, the circuit unit CA is formed in the second light-emitting area DA2.

The circuit unit CA may extend in a second direction (refer to FIG. 4) crossing the first direction in the second light-emitting area DA2.

In an exemplary embodiment, the circuit units CA may be respectively formed on a left side and a right side of the first light-emitting area DA1 between the second light-emitting areas DA2 surrounding the first light-emitting area DA1. The left side and the right side respectively are a left side and a right side from the user's point of view of FIG. 6.

The circuit unit CA may include the thin film transistor TFT on the substrate 100 in order to drive a device so that a screen may be displayed on the first light-emitting area DA1 and/or the second light-emitting area DA2.

That is, the circuit unit CA may be formed in the second light-emitting area DA2 and may include the OLED and the thin film transistor TFT provided under the OLED. The thin film transistor TFT has been described in detail above in the description of the display device 1000 according to the exemplary embodiment of FIGS. 1 to 3, and therefore, a description of the thin film transistor TFT will be omitted hereinafter for convenience of description.

In an exemplary embodiment, the circuit unit CA in the second light-emitting area DA2 may include gate wiring (not shown) and emission control wiring (not shown).

The gate wiring (not shown) may be formed of the same material and on the same layer as the gate electrode G of the thin film transistor TFT and may be connected to the gate electrode G.

The emission control wiring (not shown) may generate an emission control signal and transmit the emission control signal to the first light-emitting area DA1 and/or the second light-emitting area DA2. The emission control signal may control the light-emitting time of the first light-emitting area DA1 and/or the second light-emitting area DA2.

As the gate wiring (not shown) and the emission control wiring (not shown) are provided in the second light-emitting area DA2, a screen may be displayed.

In the display device 3000 according to the present exemplary embodiment, as illustrated in FIG. 6, the first voltage line 10 and the second voltage line 20 may be connected to the second light-emitting area DA2.

Figure 8:
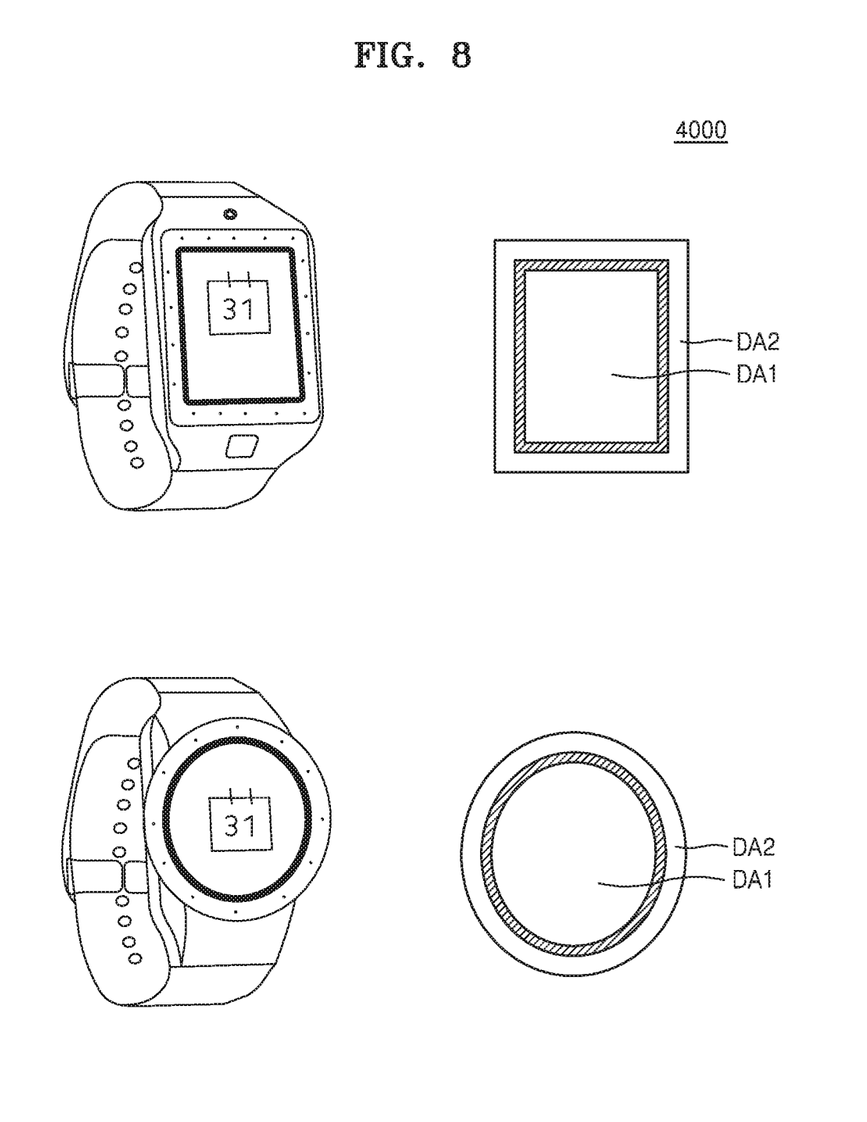
FIG. 8 is a schematic perspective view of a watch to which a display device according to an exemplary embodiment has been applied.

FIG. 8 is a schematic perspective view of a watch 4000 to which the display device 1000 according to an exemplary embodiment has been applied.

The first light-emitting area DA1 for displaying a screen may be provided on a central portion of the watch 4000, and the second light-emitting area DA2 for displaying a screen separately from the first light-emitting area DA1 may be provided on the outside of the first light-emitting area DA1.

Although it is illustrated in FIG. 8 that the watch 4000 has the substrate 100 that is quadrangle or circular, a shape of the substrate 100 is not limited thereto, and the substrate 100 may have one or more shapes.

Also, although an exemplary embodiment in which the display device 1000 according to the present exemplary embodiment is applied to the watch 4000 is illustrated in FIG. 8, the display device 1000 according to the present exemplary embodiment may be included not only in a watch but also in one or more apparatuses for displaying a screen.

As illustrated in FIG. 8, in an exemplary embodiment, the first light-blocking area BM1 including the circuit unit CA may be provided between the second light-emitting area DA2 and the first light-emitting area DA1.

The first light-emitting area DA1 and the second light-emitting area DA2 may display different screens from each other, as illustrated in FIG. 7. However, this is just an exemplary embodiment, and the first light-emitting area DA1 and the second light-emitting area DA2 may display the same screen as each other.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:
1. A display device comprising:
a substrate;
a first light-emitting area allocated over the substrate and configured to display a first image; and
an outer area surrounding the first light-emitting area and including a pad area, wherein the outer area includes a second light-emitting area configured to display a second image independently from the first image of the first light-emitting area, wherein the second light-emitting area surrounds at least two sides of the first light-emitting area, and wherein the outer area comprises a light-blocking area, wherein the light-blocking area comprises a first light-blocking area and a second light-blocking area separated from the first light-blocking area, and wherein the second light-blocking area surrounds the first light-blocking area.

2. The display device of claim 1, wherein the second light-emitting area is interposed between the first and second light-blocking areas.

3. The display device of claim 2, wherein each of the first light-blocking area, the second light-emitting area, and the second light-blocking area has a ring shape surrounding the first light-emitting area.

4. The display device of claim 1, further comprising a circuit area located on opposing sides of the first light-emitting area in the first light-blocking area, and wherein the circuit area comprises a plurality of thin film transistors (TFTs) configured to drive the first and second light-emitting areas to respectively display the first and second images.

5. The display device of claim 4, wherein the outer area comprises first and second voltage lines, and wherein the circuit area comprises gate wiring and an emission control line.

6. The display device of claim 5, wherein the first voltage line, the second voltage line, the gate wiring, and the emission control line are electrically connected to the second light-emitting area.

7. The display device of claim 1, wherein the first light-emitting area comprises an organic light-emitting diode (OLED) comprising a first electrode, an intermediate layer, and a second electrode, and wherein the second light-emitting area is included in the intermediate layer.

8. The display device of claim 7, wherein the second electrode extends to the first light-emitting area, the first light-blocking area, and the second light-emitting area.

9. The display device of claim 1, wherein the substrate is flexible, and wherein the substrate is configured to be bent along the first light-blocking area.

10. A display device comprising:
a substrate;
a first light-emitting area allocated over the substrate and configured to display a first image; and
an outer area surrounding the first light-emitting area and including a pad area, wherein the outer area includes a second light-emitting area configured to display a second image independently from the first image of the first light-emitting area,
wherein the second light-emitting area is connected to the first light-emitting area, and wherein the outer area comprises a third light-blocking area disposed outside of the second light-emitting area.

11. The display device of claim 9, wherein the second light-emitting area has a ring shape surrounding the first light-emitting area, and wherein the display device further comprises a third light-blocking area having a ring shape surrounding the second light-emitting area.

12. The display device of claim 9, wherein the second light-emitting area comprises:
an OLED comprising a first electrode, an intermediate layer, and a second electrode; and
a circuit area comprising a plurality of TFTs configured drive the first and second light-emitting areas to respectively display the first and second images.

13. The display device of claim 11, wherein the outer area comprises first and second voltage lines, and wherein the circuit area comprises gate wiring and an emission control line.

14. The display device of claim 13, wherein the first voltage line, the second voltage line, the gate wiring, and the emission control line are electrically connected to the second light-emitting area.

15. A display device comprising: a substrate;
a first light-emitting area allocated over the substrate and configured to display a first image;
a light-blocking area disposed surrounding the first light-emitting area and comprising a first light-blocking area and a second light-blocking area separated from the first light-blocking area, wherein the second light-blocking area surrounds the first light-blocking area; and
a second light-emitting area interposed between the first and second light-blocking areas and separated from the first light-emitting area to display a second image different from the first image.

16. The display device of claim 15, wherein the second light-blocking area has three edges surrounding the second light-emitting area, and wherein the display device further comprises a pad area connecting ends of two of the edges of the second light-blocking area.

17. The display device of claim 16, wherein each of the first and second light-emitting areas comprises a plurality of organic light-emitting diodes (OLEDs), and wherein the display device further comprises a circuit area disposed in the first light-blocking area and includes circuitry configured to drive the OLEDs in the first and second light-emitting areas.

18. The display device of claim 17, wherein the circuit area extends parallel to the second light-emitting area on opposing sides of the first light-emitting area.

19. The display device of claim 17, wherein the widths of the first and second light-blocking areas are substantially the same.

20. The display device of claim 1, wherein the second light-emitting area surrounds four sides of the first light-emitting area.

21. The display device of claim 1, further comprising a first light-blocking area, wherein the first light-blocking area is interposed between the first light-emitting area and the second light-emitting area.

* * * * *